(12) United States Patent
Yang

(10) Patent No.: US 7,396,713 B2
(45) Date of Patent: Jul. 8, 2008

(54) STRUCTURE AND METHOD FOR FORMING ASYMMETRICAL OVERLAP CAPACITANCE IN FIELD EFFECT TRANSISTORS

(75) Inventor: Haining Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 474 days.

(21) Appl. No.: 11/163,165

(22) Filed: Oct. 7, 2005

(65) Prior Publication Data

US 2007/0080401 A1    Apr. 12, 2007

(51) Int. Cl.
    *H01L 21/336* (2006.01)
(52) U.S. Cl. ............... 438/197; 438/302; 438/303; 438/306
(58) Field of Classification Search ............ 438/197, 438/302–306, 179; 257/288, 335
    See application file for complete search history.

(56) References Cited

U.S. PATENT DOCUMENTS

| | | |
|---|---|---|
| 5,985,724 A | 11/1999 | Kadosh et al. |
| 6,200,864 B1 | 3/2001 | Selcuk |
| 6,605,845 B1 | 8/2003 | Liang |
| 6,790,750 B1 | 9/2004 | Long et al. |
| 6,794,256 B1 | 9/2004 | Fuselier et al. |
| 2003/0001195 A1 | 1/2003 | Mori |
| 2004/0259340 A1 | 12/2004 | Chu et al. |
| 2005/0014353 A1 | 1/2005 | Mansoori et al. |
| 2005/0106844 A1* | 5/2005 | Tung et al. ............ 438/527 |
| 2006/0017103 A1* | 1/2006 | Szelag .................. 257/335 |
| 2007/0032028 A1* | 2/2007 | Zhu et al. ............. 438/303 |

\* cited by examiner

*Primary Examiner*—Tuan H Nguyen
(74) *Attorney, Agent, or Firm*—Cantor Colburn LLP; Todd Li

(57) ABSTRACT

A method for forming asymmetric spacer structures for a semiconductor device includes forming a spacer layer over at least a pair of adjacently spaced gate structures disposed over a semiconductor substrate. The gate structures are spaced such that the spacer layer is formed at a first thickness in a region between the gate structures and at a second thickness elsewhere, the second thickness being greater than said first thickness. The spacer layer is etched so as to form asymmetric spacer structures for the pair of adjacently spaced gate structures.

17 Claims, 10 Drawing Sheets

STRUCTURE AND METHOD FOR FORMING ASYMMETRICAL OVERLAP CAPACITANCE IN FIELD EFFECT TRANSISTORS

BACKGROUND

The present invention relates generally to semiconductor device processing techniques, and, more particularly, to a structure and method for forming asymmetrical overlap capacitance in field effect transistors (FETs).

In the manufacture of semiconductor devices, there is a constant drive to increase the operating speed of certain integrated circuit devices such as microprocessors, memory devices, and the like. This drive is fueled by consumer demand for computers and other electronic devices that operate at increasingly greater speeds. As a result of the demand for increased speed, there has been a continual reduction in the size of semiconductor devices, such as transistors. For example, in a device such as a field effect transistor (FET), device parameters such as channel length, junction depth and gate dielectric thickness, to name a few, all continue to be scaled downward.

Generally speaking, the smaller the channel length of the FET, the faster the transistor will operate. Moreover, by reducing the size and/or scale of the components of a typical transistor, there is also an increase in the density and number of the transistors that may be produced on a given amount of wafer real estate, thus lowering the overall cost per transistor as well as the cost of integrated circuit devices incorporating such transistors.

Unfortunately, reducing the channel length of a transistor also increases "short channel" effects, as well as "edge effects" that are relatively unimportant in long channel transistors. One example of a short channel effect includes, among other aspects, an increased drain to source leakage current when the transistor is supposed to be in the "off" or non-conductive state, due to an enlarged depletion region relative to the shorter channel length. In addition, one of the edge effects that may also adversely influence transistor performance is what is known as Miller capacitance. The Miller capacitance is a parasitic overlap capacitance ($C_{ov}$) that arises as a result of the doped polycrystalline silicon gate electrode and gate dielectric that (almost invariably) overlaps with a conductive portion of the more heavily doped source/drain regions and/or the less heavily doped source/drain extension (SDE) regions (if present) of the FET.

Moreover, as transistor dimensions continue to scale down, the gate to source/drain extension overlap needs to be kept relatively constant so that drive current can be maintained. For example, a minimum of about 20 nm/side of overlap is necessary to prevent transistor drive current ($I_{dsat}$) degradation. When an overlap is too small, a high resistance region will be created between the extension and the channel. As devices become smaller, the source extension to drain extension distance becomes narrower, resulting in a severe punch through problem.

Accordingly, it would be desirable to be able to fabricate an FET device that maintains a low series resistance between the gate and the source of the device, while at the same time minimizing adverse consequences such as short channel effects, hot carrier effects, punch through and parasitic Miller capacitance formed by excessive gate to drain overlap.

SUMMARY

The foregoing discussed drawbacks and deficiencies of the prior art are overcome or alleviated by a method for forming asymmetric spacer structures for a semiconductor device. In an exemplary embodiment, the method includes forming a spacer layer over at least a pair of adjacently spaced gate structures disposed over a semiconductor substrate. The gate structures are spaced such that the spacer layer is formed at a first thickness in a region between the gate structures and at a second thickness elsewhere, the second thickness being greater than said first thickness. The spacer layer is etched so as to form asymmetric spacer structures for the pair of adjacently spaced gate structures.

In another embodiment, a method for forming field effect transistor (FET) structures for a semiconductor device includes forming at least a pair of adjacently spaced gate structures over a semiconductor substrate, and forming a spacer layer over the adjacently spaced gate structures. The gate structures are spaced such that the spacer layer is formed at first thickness in a region between the gate structures and at a second thickness elsewhere, the said second thickness being greater than said first thickness. The spacer layer is etched so as to form asymmetric spacer structures adjacent sidewalls of the pair of adjacently spaced gate structures, and the substrate is implanted with doped regions having asymmetric characteristics in accordance with the asymmetric spacer structures.

In still another embodiment, a method for forming field effect transistor (FET) structures for a semiconductor device includes forming at least a pair of adjacently spaced gate structures over a semiconductor substrate, forming offset spacers adjacent sidewalls of the pair of adjacently spaced gate structures, and forming extension regions in the substrate. A second spacer layer is formed over the offset spacers, the gate structures and the substrate. The second spacer layer is subjected to a single, angled ion implantation of a neutral species, the angled ion implantation originating from a single direction. The second spacer layer is etched, wherein portions of the second spacer layer subjected to said angled ion implantation are etched at a faster rate than unexposed portions thereof, thereby forming asymmetrical second spacers adjacent the offset spacers. The substrate is then implanted with source and drain regions.

In still another embodiment, a field effect transistor (FET) device, includes a gate structure formed over a semiconductor substrate, a first pair of spacer structures formed on sidewalls of the gate structure, and a second pair of spacer structures formed adjacent the first pair of spacer structures, the second pair of spacer structures having an asymmetrical thickness with respect to one another. A source region and extension thereof is implanted on one side of the gate structure, and a drain region and extension thereof is implanted on the other side of the gate structure. The extension of the source region has a different length than the extension of the drain region, in accordance with said asymmetrical thickness of the second pair of spacer structures.

BRIEF DESCRIPTION OF THE DRAWINGS

Referring to the exemplary drawings wherein like elements are numbered alike in the several Figures.

DETAILED DESCRIPTION

Disclosed herein is a method and structure for reducing overlap capacitance in field effect transistors (FETs). In a conventional FET fabrication process, the spacer structures formed on opposite sides of the gate conductor are generally symmetrical, such that subsequently formed source and drain extensions have the same amount of overlap with respect to the gate. However, because the transistor drive current is primarily controlled by the amount of source side overlap (i.e., gate to source resistance), the amount of drain side overlap can still be reduced without adversely impacting drive current. On the other hand, the reduction in gate to drain overlap is beneficial in terms of short channel effects, punch through, hot carrier effects and parasitic capacitance, for example.

Furthermore, as device dimensions shrink, the extension resistance becomes dominant. A shorter source side extension (as a result of a narrower spacer width) will reduce the series resistance and improve device performance, without also causing problems such as hot carrier effects, since the drain side extension (as a result of not reducing the spacer width) is still maintained at an appropriate length. This is in contrast to conventionally formed symmetrical extensions for the source and drain sides, which in turn result in symmetrical source and drain extension lengths.

Accordingly, as described in further detail herein, the disclosed invention embodiments utilize various fabrication techniques to produce asymmetric spacer structures that in turn result in source and drain extension having long and short overlaps, as well as long and short extensions themselves.

Figure 1:
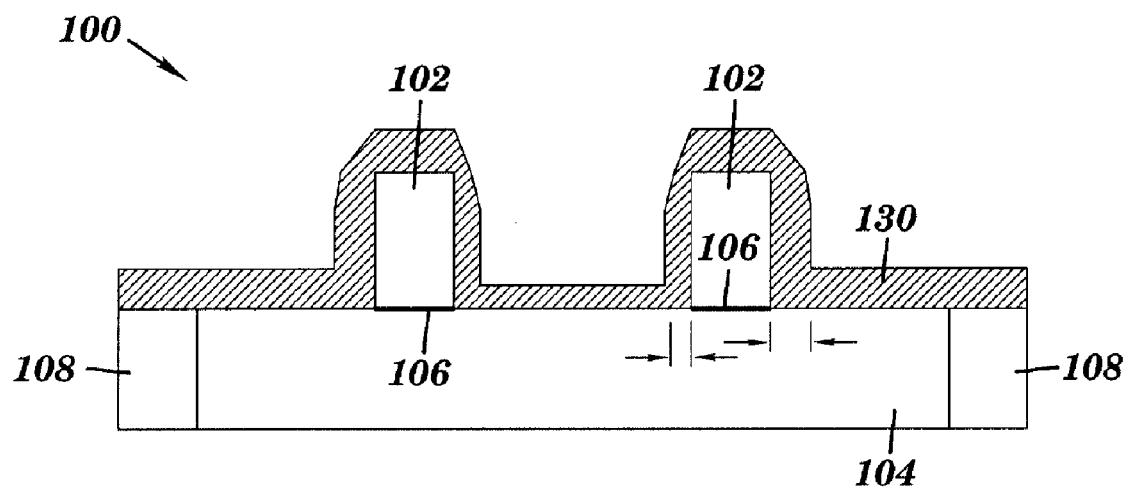
FIGS. 1 through 3 are a series of a cross sectional views illustrating the formation of asymmetrical source and drain overlap regions in an FET device, in accordance with an exemplary embodiment of the invention.
Figure 2:
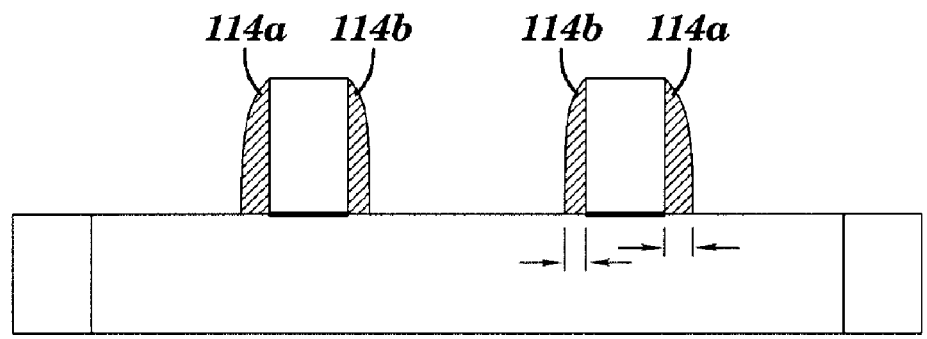
Figure 3:
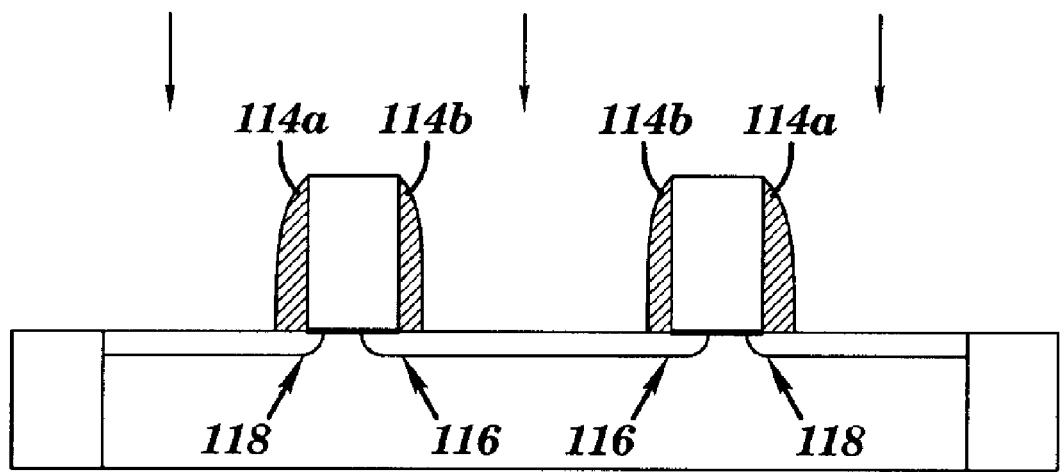
Figure 4:
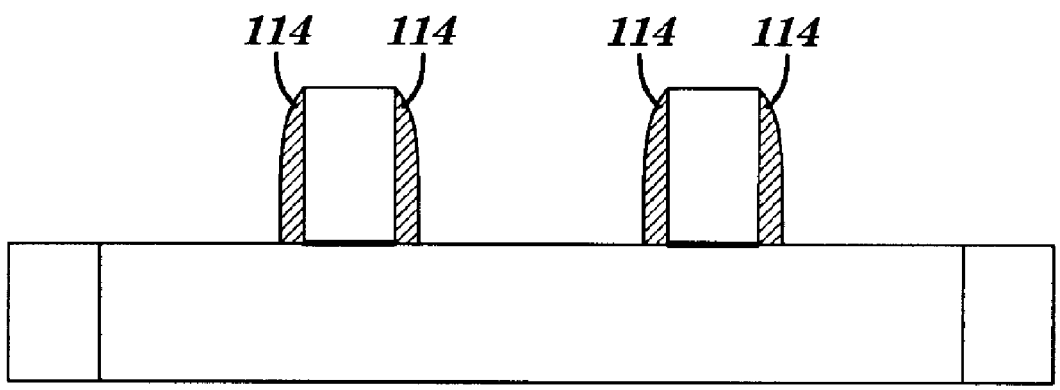
FIGS. 4 through 7 and FIG. 9 are a series of a cross sectional views illustrating the formation of asymmetrical source and drain extension regions in an FET device, in accordance with an alternative embodiment of the invention.

Referring initially to FIGS. 1 through 3, there is shown a series of cross sectional views illustrating the formation of asymmetrical source and drain overlap regions for a pair of FET devices 100, in accordance with an exemplary embodiment of the invention. In particular, FIG. 1 illustrates a pair of adjacent gate conductors 102 formed over a semiconductor substrate 104 (e.g., silicon), with the gates 102 being formed on corresponding gate oxide layers 106. Shallow trench isolation (STI) structures 108 are also illustrated for electrically isolating individual devices from one another on the substrate 104. As the basic FET structures are well known to one skilled in the art, certain features such as the STIs 108 and gate oxide layers 106 are not discussed in further detail herein.

As is also shown in FIG. 1, a spacer layer 130 of non-uniform thickness is formed over a pair of gate structures 102. The embodiment of FIG. 1 makes use of two neighboring gates in close proximity (e.g., a separation therebetween of about 1 to 3 times the gate height). By selectively tuning the deposition parameters in forming the spacer layer 130, a thinner film will be formed over the region between the two gates with respect to the regions on the outside of the gates. As such, when the spacer layer 130 is patterned and etched, the asymmetric spacers 114*a*, 114*b* will result from the constant etch rate of a layer of non-uniform thickness, as illustrated in FIG. 2.

Following the formation of the asymmetrical spacers, FIG. 3 illustrates a halo and extension implantation step in accordance with standard device processing. After an anneal to drive the implanted dopant materials, it is seen that the extensions 116 corresponding to the thinner spacers 114*b* have longer overlaps than the extensions 118 corresponding to the thicker spacers 114*a*. In other words, the "long overlap" extensions 116 extend further beneath the gate than do the "short overlap" extensions 118. In a preferred embodiment, the source terminal of the FET structures will be located at the long overlap extension side of the gate (to maintain drive current) while the drain terminal is located at the short overlap extension side of the gate (to reduce overall overlap capacitance and improve short channel effects).

The principles of asymmetric spacer formation through non-uniform layer formation may also be applied during the formation of the deep source and drain regions as well. FIGS. 4 through 7 and FIG. 9 are a series of a cross sectional views illustrating the formation of asymmetrical source and drain extension regions in an FET device, in accordance with another embodiment of the invention. Beginning in FIG. 4, offset spacers 114 are initially formed over the FET gate structures.

Figure 5:
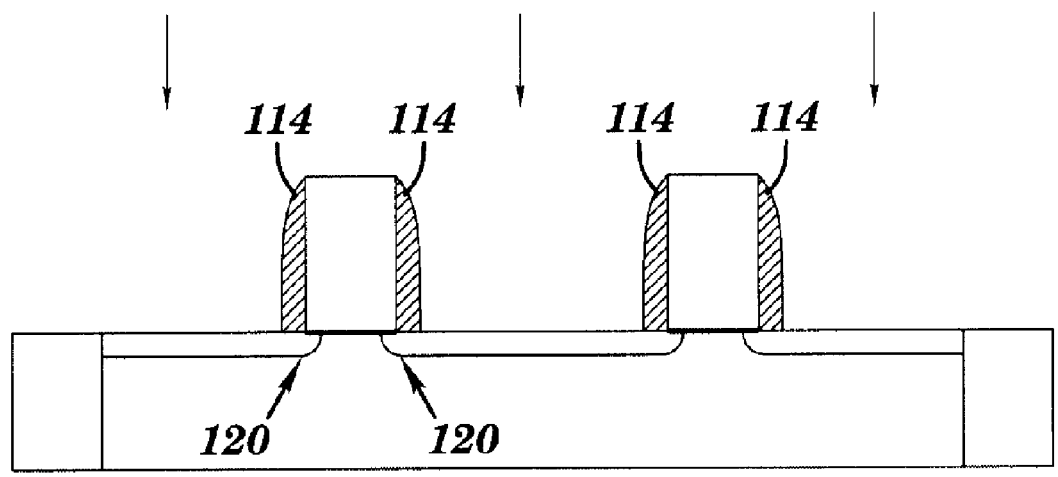

The spacers 114 may be symmetrical (i.e., substantially equal thickness on both sides of the gate) as in a conventional process or, alternatively, the spacers 114 could be formed asymmetrically as shown in FIG. 2. For purposes of illustration, the offset spacers 114 are depicted as symmetric in the present sequence. FIG. 5 illustrates a halo and extension implantation step in accordance with standard device processing, followed by an anneal to diffuse the implanted dopant materials. For symmetrical offset spacers 114, the resulting extensions 120 on both sides of the gates will have substantially equal overlaps. On the other hand, if the spacers 114 are formed in accordance with the processing shown in FIGS. 1-2, then asymmetrical extensions will appear as shown in FIG. 3.

Figure 6:
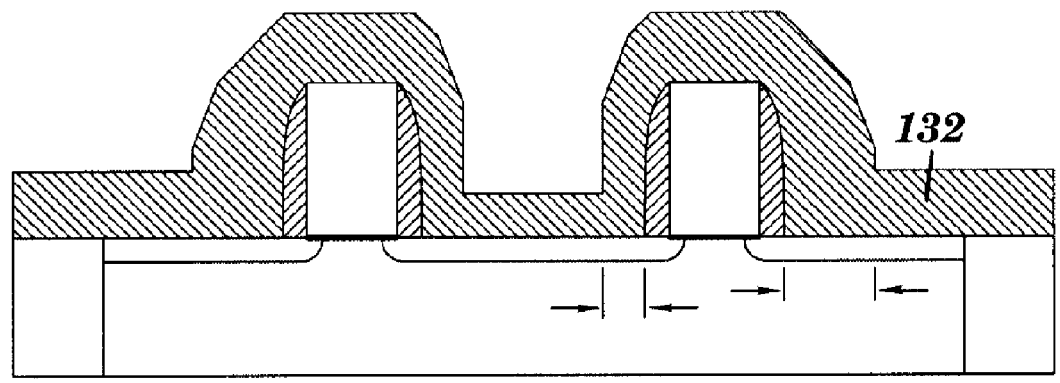
Figure 7:
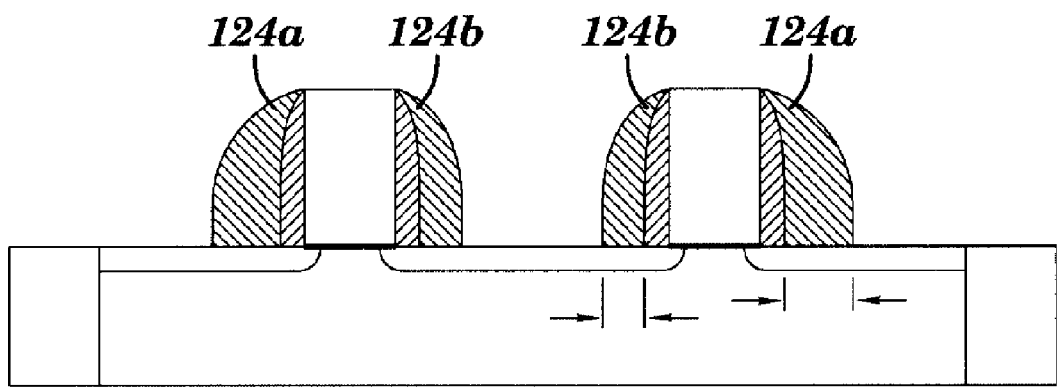
Figure 8:
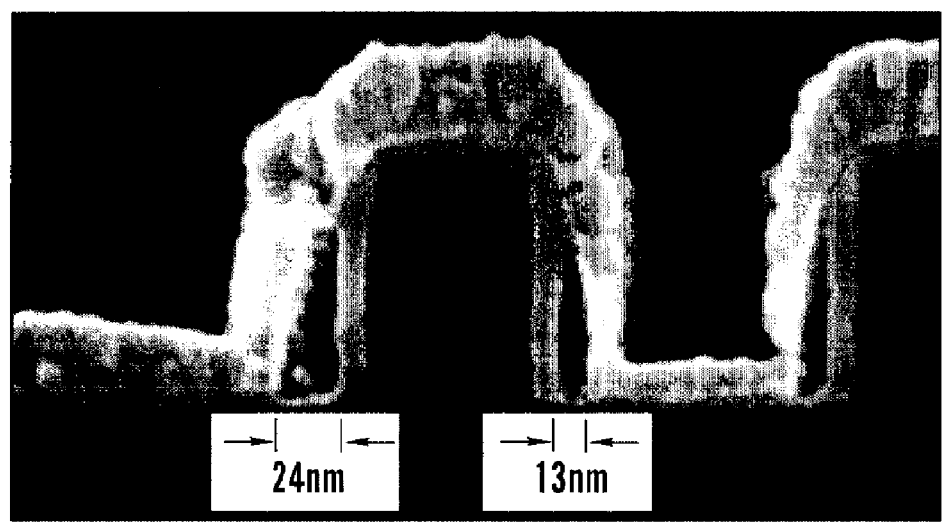
FIG. 8 is an exemplary SEM image of a device formed in accordance with the processing step shown in FIG. 7.

As then shown in FIG. 6, a non-uniform second spacer layer 132 (e.g., $Si_3N_4$) is formed over the device. Similar to the embodiment of FIG. 1, the second spacer layer 132 (given a sufficiently close distance between gates and properly tuned process conditions) will be formed thinner in the region between the gates, and thicker in the regions outside the gates. Once the second spacer layer 132 is patterned and etched in FIG. 7, the asymmetric spacers 124*a*, 124*b* are formed. By way of illustration, FIG. 8 is an exemplary SEM image of a device formed in accordance with the processing step shown in FIG. 7.

Figure 9:
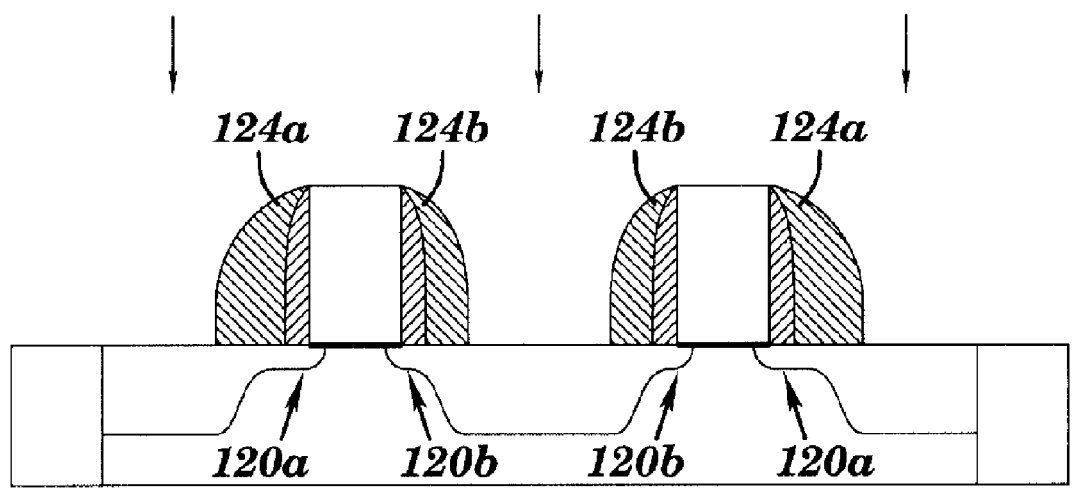

Through the formation of the asymmetric spacers 124*a*, 124*b*, the source/drain ion implantation step shown in FIG. 9 results in extensions with different lengths. More specifically, the extensions 120*a* on the outside of the gates are longer in comparison to the extensions 120*b* between the gates. This is due to the fact that the deep source/drain implant comes closer to the gate where the second set of spacers is thinner, thus shortening the extension regions formed in FIG. 5. With such shorter extensions, there is a lower resistance to carriers (e.g., electrons or holes). In such an embodiment, it would be practical to have a common source terminal located between the gates to reduce the series resistance, while the drain terminals are located outside the gates where the extensions are longer.

Figure 10:
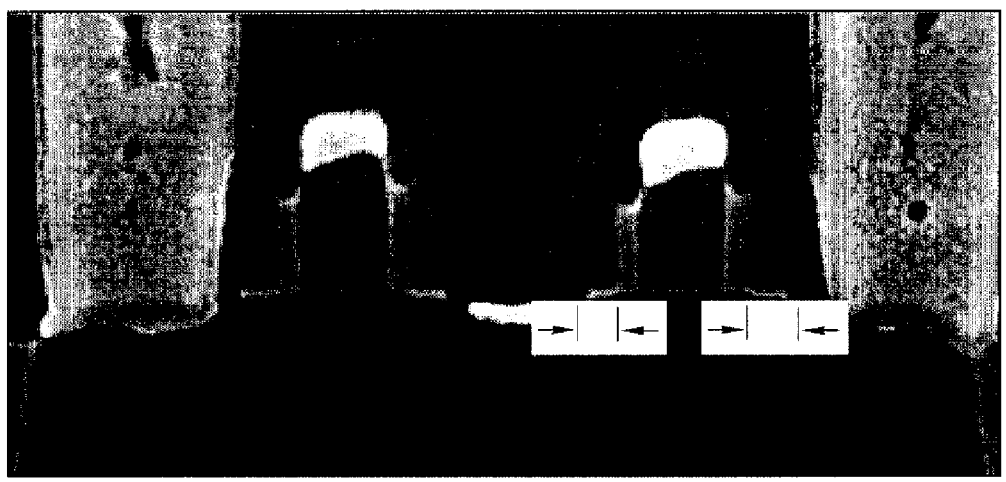
FIG. 10 is an exemplary SEM image of a portion of an SRAM cell having asymmetric spacers.

One suitable example of such an application could be the PFET device pair of an SRAM cell, which has the source terminals thereof connected to the supply voltage ($V_{DD}$). FIG. 10 is an exemplary SEM image of a portion of an SRAM cell having asymmetric spacers, similar to the embodiment shown in FIG. 9. As will be noted, the thinner spacers are located between the two gates.

FIGS. 11 through 14 illustrate another technique for forming asymmetric spacers, in accordance with a further embodiment of the invention. As with the previous embodiments discussed above, FIG. 11 illustrates a pair of gate conductors 102 formed over a semiconductor substrate 104, gate oxide layers 106 and STI structures 108. In addition, a spacer layer 110 (e.g., oxide, TEOS, silicon nitride) is formed over the devices 100 for the purpose of forming spacers prior to dopant implantation.

Figure 11:
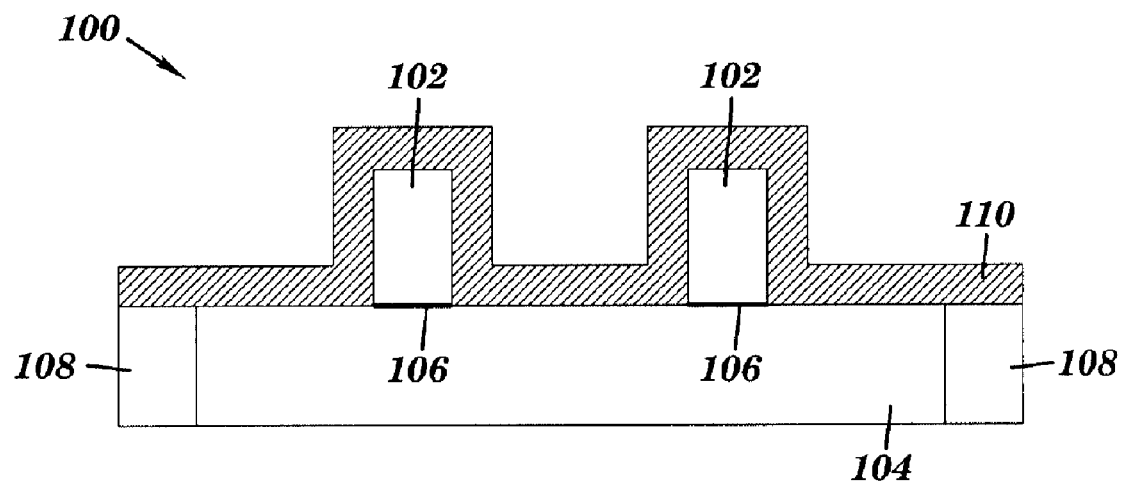
FIGS. 11 through 14 are a series of a cross sectional views illustrating the formation of asymmetrical source and drain overlap regions in an FET device, in accordance with an alternative embodiment of the invention.
Figure 12:
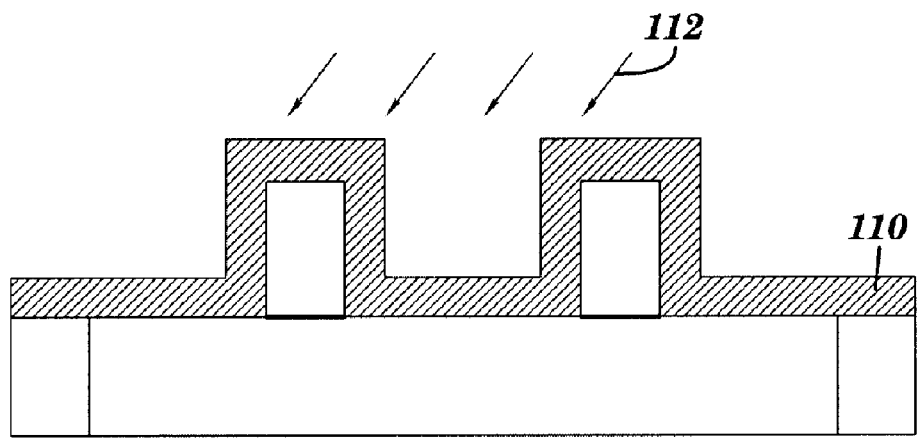
Figure 13:
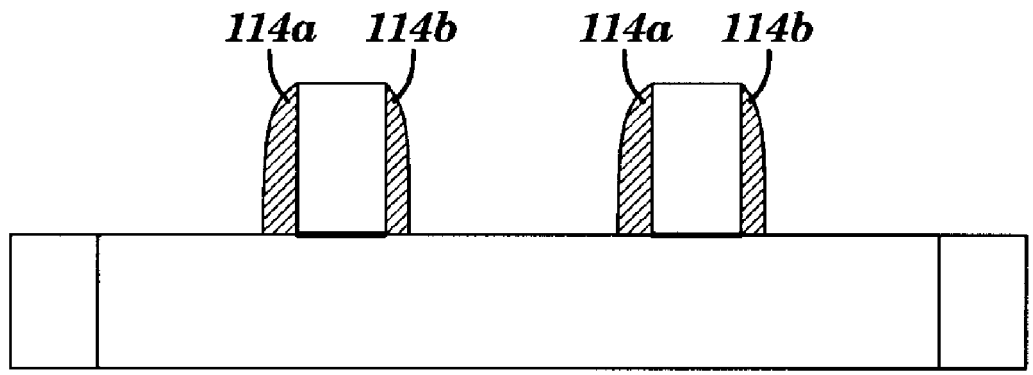

Conventionally, the spacer layer 10 of FIG. 11 would then be patterned and uniformly etched to result in substantially symmetric spacers along the sidewalls of the gate conductors 102. However, as shown in FIG. 12, the wafer is then subjected to an angled ion implantation (arrows 112) of a neutral dopant species such as germanium (Ge) or xenon (Xe), for example. This results in the spacer layer 110, on one side of the gate structures, having receiving the angled ion implant. In an exemplary embodiment, the implant angle may be on the order from about 10 degrees to about 35 degrees. The effect of such an implant is to increase the etch rate of implanted portions of the spacer layer 110 with respect to the remainder of the layer. Thus, when the implanted spacer layer 110 is subsequently patterned and etched, as shown in FIG. 13, each gate is left with a pair of spacers 114a, 114b, wherein the spacers 114b on the implanted side of the gate are thinner (i.e., asymmetrical) with respect to the spacers 114a on the non-implanted side of the gate.

Figure 14:
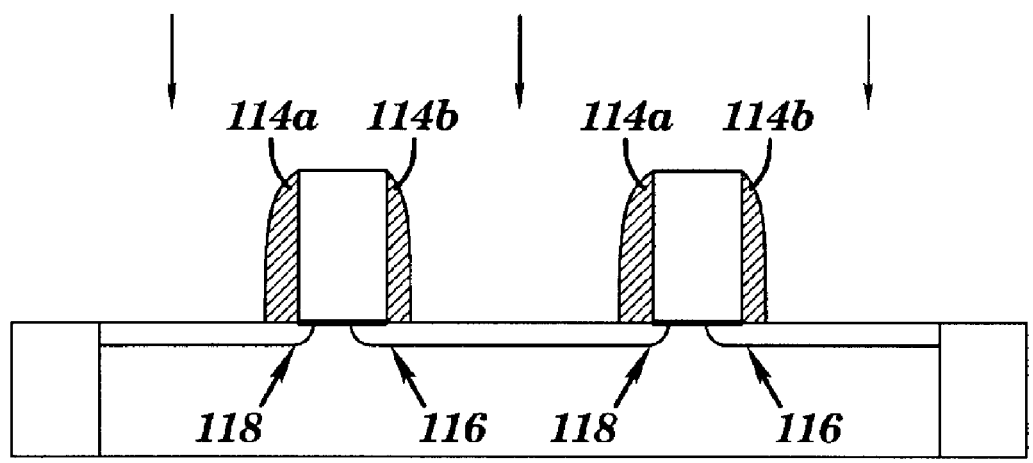
Figure 15:
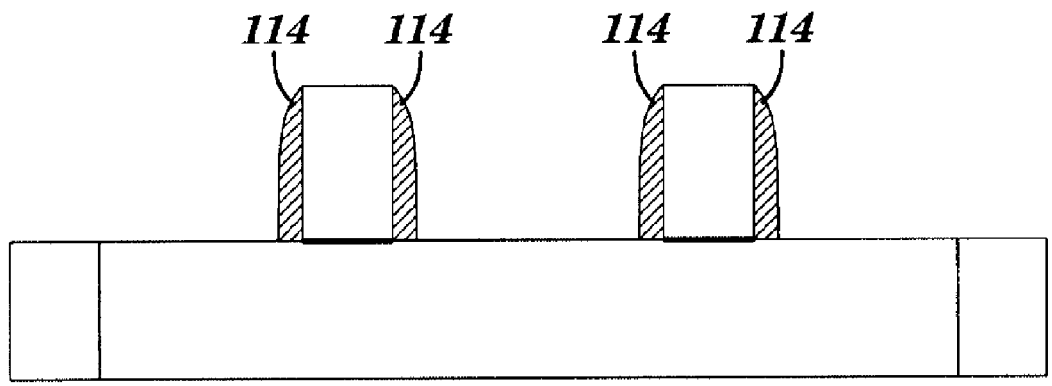
FIGS. 15 through 20 are a series of a cross sectional views illustrating the formation of asymmetrical source and drain extension regions in an FET device, in accordance with still another embodiment of the invention.

Following the formation of the asymmetrical spacers, FIG. 14 illustrates a halo and extension implantation step to form the extensions having longer and shorter overlaps 116, 118, similar to the structure of FIG. 3. However, whereas the longer overlaps 116 of FIG. 3 are located on the inside of the gates, the longer overlaps 116 of FIG. 14 are located on the right side of the gates.

The principles of asymmetric spacer formation through ion implantation may also be applied during the formation of the source and drain regions as well. FIGS. 15 through 20 are a series of a cross sectional views illustrating the formation of asymmetrical source and drain extension regions in an FET device, in accordance with another embodiment of the invention. Beginning in FIG. 15, the FET structures are shown after the formation of offset spacers 114. As with FIG. 4, the offset spacers 114 may either by symmetrically formed or asymmetrically formed prior to the halo/extension ion implant step of FIG. 5.

Figure 16:
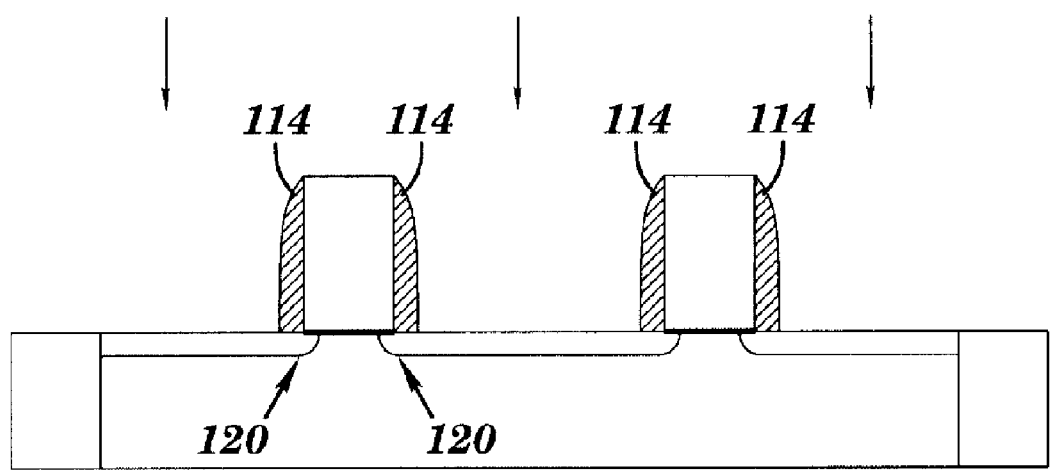
Figure 17:
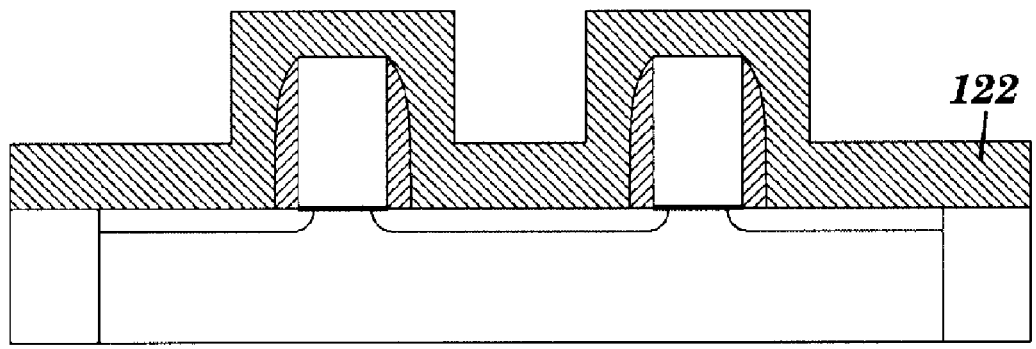

FIG. 16 illustrates a halo and extension implantation step in accordance with standard device processing, followed by an anneal to diffuse the implanted dopant materials. For symmetrical offset spacers, the resulting extensions 120 on both sides of the gates will have substantially equal overlaps. On the other hand, if the spacers 114 are formed in accordance with the processing shown in FIGS. 12-13, then the extensions 120 will appear as shown in FIG. 14. In either case, a second spacer layer 122 (e.g., $Si_3N_4$) is then formed over the device as shown in FIG. 17.

Figure 18:
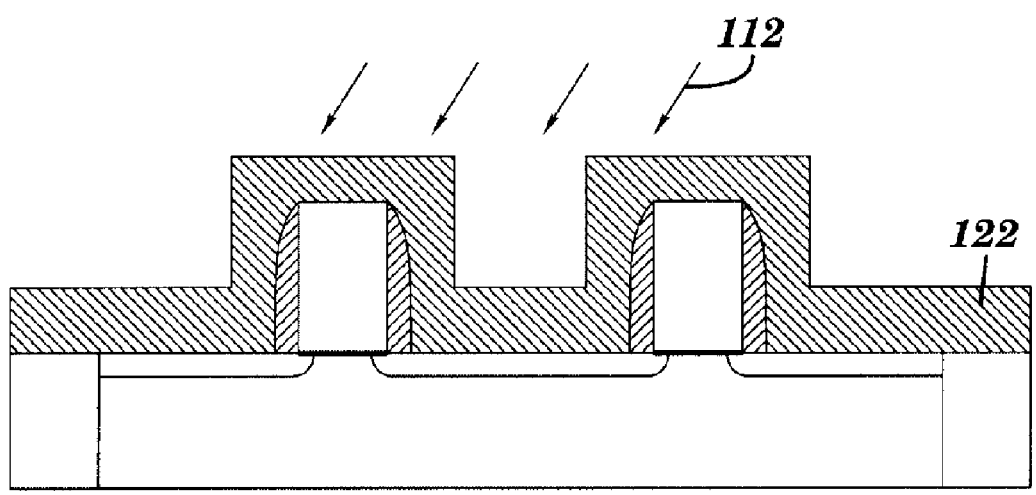
Figure 19:
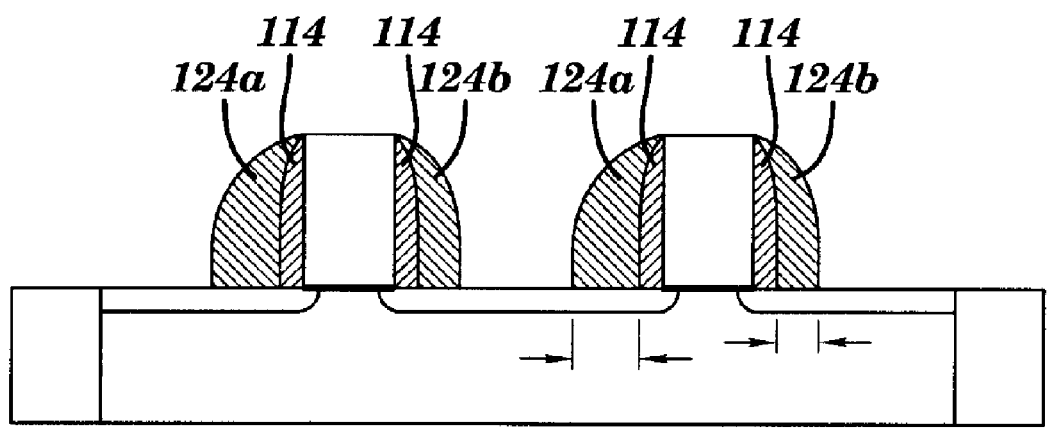

Then, as shown in FIG. 18, the second spacer layer 122 is subjected to an angled ion implantation (arrows 112) of a neutral dopant species, in a manner similar to that discussed in the previous embodiment. Again, this has the effect of increasing the etch rate of the implanted portions of the layer 122. Thus, when the layer 122 is patterned and etched as shown in FIG. 19, a second set of spacers 124a, 124b is formed over the first set of offset spacers 114. Regardless of whether the first set of offset spacers 114 is symmetric or asymmetric, the second set of spacers will in fact be asymmetric due to the angled implantation shown in FIG. 18. In particular, the non-implanted side of the gate structures include thicker spacers 124a, while the implanted side of the gate structure includes thinner spacers 124b.

Figure 20:
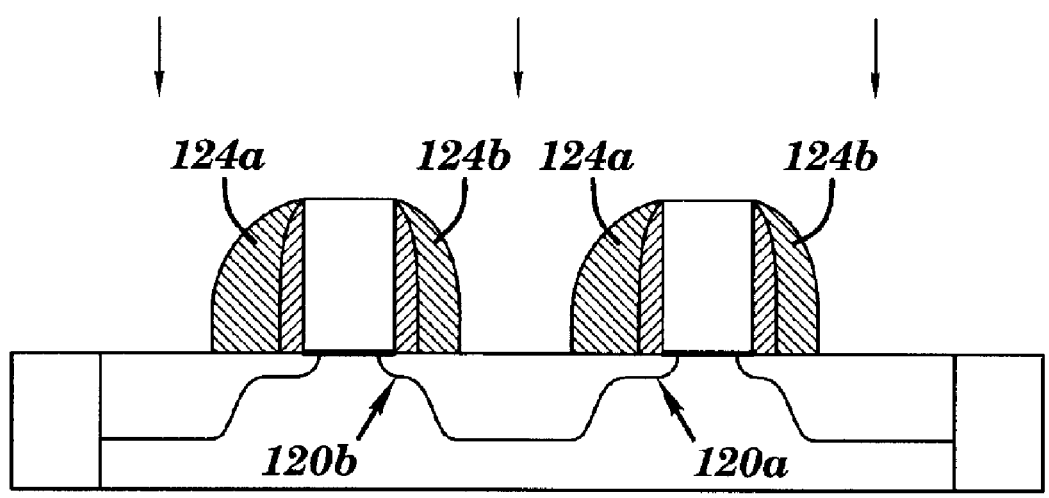

As finally illustrated in FIG. 20, the wafer is then subjected to a (deep) source/drain implantation in accordance with conventional process doping. However, on the side of the gates corresponding to the thinner spacers 124b, the resulting extensions 120b that remain after the deep source/drain implant become shorter in length than the extensions 120a on the side of the gates corresponding to the thicker spacers 124a. Thus, in a preferred embodiment, the source side of the FETs is located at the sides of the gate corresponding to the thinner spacers 124b. In contrast, the drain side extensions are still maintained at a certain length in order to prevent hot carrier effects.

Through the use of an angled, neutral dopant implantation step in order to increase the etch rate of a spacer layer, an FET device having asymmetrical spacer thicknesses may be achieved. This in turn allows for extensions with long/short overlaps, as well as longer and shorter extensions themselves. However, additional methods are also contemplated that will result in the asymmetric spacers such as discussed above.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming asymmetric spacer structures for a semiconductor device, the method comprising:

forming a spacer layer over at least a pair of adjacently spaced gate structures disposed over a semiconductor substrate, wherein said gate structures are spaced such that said spacer layer is formed at first thickness in a region between said gate structures and at a second thickness elsewhere, said second thickness greater than said first thickness; and etching the spacer layer so as to form asymmetric spacer structures adjacent sidewalls of said pair of adjacently spaced gate structures.

2. The method of claim 1, wherein said asymmetric spacer structures further comprise offset spacers used in the definition of halo and extension implantation regions.

3. The method of claim 1, wherein said asymmetric spacer structures further comprise second spacers formed over offset spacers, said second spacers used in the definition of source and drain regions.

4. The method of claim 1, wherein a distance between said pair of adjacently spaced gate structures is about 1 to 3 times a height of said gate structures.

5. A method for forming field effect transistor (FET) structures for a semiconductor device, the method comprising:

forming at least a pair of adjacently spaced gate structures over a semiconductor substrate;

forming a spacer layer over said adjacently spaced gate structures, wherein said gate structures are spaced such that said spacer layer is formed at first thickness in a region between said gate structures and at a second thickness elsewhere, said second thickness greater than said first thickness;

etching the spacer layer so as to form asymmetric spacer structures adjacent sidewalls of said pair of adjacently spaced gate structures; and implanting said substrate with doped regions, said doped regions having asymmetric characteristics in accordance with said asymmetric spacer structures.

6. The method of claim 5, wherein spacer structures corresponding to said first thickness of said spacer layer are thinner than spacer structures corresponding to said second thickness of said spacer layer.

7. The method of claim 6, wherein said asymmetric spacer structures further comprise offset spacers, and said doped regions further comprising source/drain extensions following halo and extension implantations.

8. The method of claim 7, wherein said extensions corresponding to thinner offset spacers have a longer gate overlap than said extensions corresponding to thicker offset spacers.

9. The method of claim 6, wherein said asymmetric spacer structures further comprise second spacers formed over offset spacers, and said doped regions further comprising source and drain regions.

10. The method of claim 9, wherein said doped regions corresponding to thinner second spacers further comprise source regions and said doped regions corresponding to thicker second spacers further comprise drain regions.

11. The method of claim 10, wherein said source regions have shorter extensions than said drain regions.

12. The method of claim 6, wherein a distance between said pair of adjacently spaced gate structures is about 1 to 3 times a height of said gate structures.

13. A method for forming field effect transistor (FET) structures for a semiconductor device, the method comprising:

forming at least a pair of adjacently spaced gate structures over a semiconductor substrate;

forming offset spacers adjacent sidewalls of said pair of adjacently spaced gate structures;

forming extension regions in said substrate;

forming a second spacer layer over said offset spacers said gate structures and said substrate;

subjecting said second spacer layer to a single, angled ion implantation of a neutral species, said angled ion implantation originating from a single direction;

etching said second spacer layer, wherein portions of said second spacer layer subjected to said angled ion implantation are etched at a faster rate than unexposed portions thereof, thereby forming asymmetrical second spacers adjacent said offset spacers; and implanting said substrate with source and drain regions.

14. The method of claim 13, wherein said source regions have shorter extensions than said drain regions.

15. The method of claim 14, wherein said neutral species further comprises at least one of germanium and silicon.

16. The method of claim 13, wherein said offset spacers are also formed asymmetrically by angled ion implantation of a neutral species in a first spacer layer formed over said gate structures and said substrate.

17. The method of claim 16, wherein said extension regions corresponding to thinner offset spacers have a longer gate overlap than extension regions corresponding to thicker offset spacers.

* * * * *